United States Patent [19]

Hazman

[11] Patent Number: 5,625,403
[45] Date of Patent: Apr. 29, 1997

[54] METHOD AND APPARATUS FOR RECORDING ON OPTICALLY-SENSITIVE MEDIA

[75] Inventor: Erez Hazman, Kiryat Ono, Israel

[73] Assignee: Orbotech Ltd., Yavne, Israel

[21] Appl. No.: 309,773

[22] Filed: Sep. 21, 1994

[30] Foreign Application Priority Data

Nov. 5, 1993 [IL] Israel ......................... 107508

[51] Int. Cl.$^6$ ............... B41J 2/47; G01D 15/14; G02F 1/11; G03B 27/72
[52] U.S. Cl. ........................... 347/239; 347/243
[58] Field of Search ................... 347/239, 255, 347/259, 243

[56] References Cited

U.S. PATENT DOCUMENTS

| | | | |
|---|---|---|---|
| 3,590,248 | 6/1971 | Chatterton, Jr. | 350/199 |
| 4,111,524 | 9/1978 | Tomlinson, III | 350/96.19 |
| 4,244,045 | 1/1981 | Nosu et al. | 370/3 |
| 4,294,508 | 10/1981 | Husbands | 350/96.15 |
| 4,359,259 | 11/1982 | Horner et al. | 350/3.7 |
| 4,387,955 | 6/1983 | Ludman et al. | 350/96.19 |
| 4,431,258 | 2/1984 | Fye | 350/1.6 |
| 4,482,994 | 11/1984 | Ishikawa | 370/3 |
| 4,506,275 | 3/1985 | Maeda | 346/108 |
| 4,516,838 | 5/1985 | Bademian | 350/358 |
| 4,622,662 | 11/1986 | Laude et al. | 370/3 |
| 4,701,012 | 10/1987 | Kaiser | 350/96.19 |
| 4,736,360 | 4/1988 | McMahon | 370/3 |
| 4,763,975 | 8/1988 | Scrifes et al. | 350/96.15 |
| 4,770,653 | 9/1988 | Shturman | 604/21 |
| 4,794,615 | 12/1988 | Berger et al. | 372/69 |
| 4,819,224 | 4/1989 | Laude | 370/3 |
| 4,956,813 | 9/1990 | Seya et al. | 365/127 |
| 5,066,962 | 11/1991 | Sarraf | 346/76 L |
| 5,373,491 | 12/1994 | Terao et al. | 369/102 |
| 5,386,221 | 1/1995 | Allen et al. | 347/239 |

FOREIGN PATENT DOCUMENTS 2256503 12/1992 United Kingdom.

OTHER PUBLICATIONS

J.R. Leger, et al., Coherent addition of AlGaAs lasers using microlenses and diffractive coupling, Appl. Phys. Lett. 52(21) 1988, pp. 1771–1773.
J.R. Leger, et al., Coherent beam assition of GaAlAs lasers by binary phase gratings, Appl. Phys. Lett. 48(14), 1986, pp. 888 890.
B. Moslehi, et al., Fiber-optic wavelength–division multiplexing and demultiplexing using volume holographic gratings, Optics Letters, 14, 1989, pp. 1088–1090.
R.C. Fairchild, et al., Computer–originated aspheric holographic optical elements, Optical Engineering, 21, 1982, pp. 133–139.
M. Iida, et al., Narrow–band ten–channel optical multiplexer and demultiplexer using a Fourier diffraction grating, Applied Optics, 31, 1992, pp. 4051–4057.
Y. Amitai, et al., Recursive design techniques for Fourier transform holographic lenses, Optical Engineering, 26, 1987, pp. 1133–1139.
E. Hasman, et al., Analytic optimization for holographic optical elements, Journal of the Optical Society of America, 6 1989, pp. 62–72.
W.J. Tomlinson, Wavelength multiplexing in multimode optical fibers, Applied Optics, 16, 1977, pp. 2180–2194.

*Primary Examiner*—Benjamin R. Fuller
*Assistant Examiner*—Raquel Yvette Gordon
*Attorney, Agent, or Firm*—Ladas & Parry

[57] ABSTRACT

A method and apparatus for recording on an optically-sensitive medium by providing a plurality of light sources each emitting a source beam of light of different wavelengths falling within the sensitivity range of the optically-sensitive medium; combining, by wavelength multiplexing, the plurality of source beams into a combined beam; and directing the combined beam onto the optically-sensitive medium.

18 Claims, 4 Drawing Sheets

METHOD AND APPARATUS FOR RECORDING ON OPTICALLY-SENSITIVE MEDIA

FIELD OF THE INVENTION

The present invention relates to a method and also to apparatus for recording on optically-sensitive media. The invention is particularly useful in thermal laser plotters for recording on a direct write film (DWF), for example, for use in the production of printed circuit boards (PCBs) or for graphic art applications, and the invention is therefore described below particularly with respect to such applications.

One of the advantages of using thermal laser plotters for the above applications is that CAD (computer-aided design) data is written directly on a DWF, producing a phototool, thus eliminating the wet developing stage which is necessary for silver halide films, and enabling on-line verification of the data imaged on the phototool. The use of DWF also overcomes such disadvantages of silver halide films as limited dimensional stability, many handling processes, and a long turn-around cycle. Current research is directed by the film companies for the development of a suitable DWF. Unfortunately, however, the known types of DWFs generally suffer from low sensitivity.

For this reason, a high optical power source is required in order to realize an optical head for a laser thermal plotter while ensuring sufficient recording speed. It is not practical to exploit large and expensive high power gas or solid state lasers. More preferable laser sources, used now in thermal plotters, are diode lasers, which are small and efficient, and their low voltage drive requirements are compatible with the signal levels available from highly reliable solid state circuit components. In the designing of a laser plotter, these features are important because they result in decreased system size and weight, in reduced cooling and electrical requirements and in increased overall system reliability.

Unfortunately diode lasers emit at relatively low powers, thereby limiting the writing speed of the plotter, given the low media (DWF) sensitivities available. For realizing a high power optical head, it is necessary in general to resort to diode laser arrays with typical dimensions of one micron by several hundreds (or thousands) microns. These linear light sources usually offer higher power than the corresponding point sources (diffraction limited source). However for such lasers, the product of the source area ($A_s$) with the solid divergence angle of the source ($\Omega_s$), that is ($A_s\Omega_s$), is larger compared to the diffraction limited lasers ($A\Omega=\lambda^2$ for diffraction limited source; $\lambda$ is the wavelength). As noted, for such broad area diode lasers the solid divergence angle ($\Omega_s$) is approximately constant without dependency of the lasting area. The requirement of the optical head to concentrate the writing spot to a specific area ($A_r$) with a solid writing angle ($\Omega_r$) gives us a limitation for the total lasing area due to the thermodynamic invariance or the conservation of optical radiance given by $A_s\Omega_s < A_r\Omega_r$.

Because of these limitations, many optical head concepts require a source not only of high power but also of high brightness, which is power per unit area per unit angle divergence of the laser. Semiconductor diode laser materials have a power density limitation dictated by either breakdown at high optical fields or heat removal efficiency. These limitations restrict the optical power per unit area able to pass throughout the laser. In addition, the divergence of the source is large for a broad area (as mentioned before), because of the unphase locked field in the plane parallel to the junction. The source brightness is thereby constrained by these two effects (power density and angular divergence of the laser).

Higher brightness than a single source may be achieved by combining individual outputs of diode lasers to produce a single beam. One example of such a combination is realized by using a coherent addition (combination) of diode lasers which is based on a common external cavity mirror, in the technique described in "Coherent Beam Addition of GaAlAs Lasers by Binary Phase Gratings", J. R. Leger, G. J. Swanson, and W. B. Weldkamp, Appl. Phys. Lett 48, 888, 1986, and in "Coherent Addition of AlGaAs Lasers Using Microlenses and Diffractive Ccoupling", J. R. Leger, M. L. Scott, and W. B. Weldkamp, Appl. Phys. Left. 52, 1771, 1988. This method is very complicated to fabricate and very sensitive to optical alignments.

Another example of creating a higher power optical head, in particular for a thermal laser printer, is described in U.S. Pat. No. 5,066,962. The problem to combine two diode laser beams is solved in this patent by exploiting two orthogonal polarized beams of the same wavelength. A beam from one of the lasers is passed through a half-wave plate, and the beam is then combined with the beam from the second laser by a polarization beam splitter. However, this method does not allow to combine more than two lasers, thus still limiting the power of such an optical head.

The present invention provides another method and apparatus to combine laser beams in order to overcome the above-described power and brightness problems, enabling the realization of a practical high power optical head.

SUMMARY OF THE INVENTION

According to one aspect of the present invention, there is provided a method of recording on an optically-sensitive medium, comprising: providing a plurality of at least two light sources each emitting a source beam of light of different wavelengths falling within the sensitivity range of the optically-sensitive medium; combining, by wavelength multiplexing, the plurality of source beams into a combined beam; and directing the combined beam onto the optically-sensitive medium.

According to further features in the described preferred embodiments, the light sources are diode lasers of different wavelengths. Preferably, the light sources are such as to produce a combined beam of at least one watt of power.

It will thus be seen that the novel method of recording is based on the technique called wavelength multiplexing. This technique is widely used in communication systems for multiplexing a plurality of communication channels onto a single channel at the transmitting end, and then demultiplexing the plurality of channels into their separate channels at the receiving end. In this technique as applied to multichannel communication, multiplexing at the transmitting end is followed by demultiplexing at the receiving end, the transmission path between the multiplexer and demultiplexer is generally very long (e.g., kilometers), the input power of each channel at the transmission end is generally in the order of milliwatts, and the output power at the receiver end is generally in the order of microwatts or nanowatts.

In contrast, the wavelength multiplexing technique is used in the present invention for generating a bright light source for use in recording on an optically-sensitive medium, such as in a laser plotter, in a direct write film technique for producing printed circuit boards, or for other graphic art applications. The output power is at least one watt, rather than of microwatts or nanowatts, the combined beam is transmitted a relatively short distance (e.g., up to a few meters) such that the losses are very low or negligible, and the combined beam is not demultiplexed. The novel method thus exploits the above-described advantageous characteristics of laser diodes, and the further characteristic that laser diodes can be made to lase in a wide range of wavelengths.

According to further features in one preferred embodiment of the invention described below, the combined beam is produced by also combining two orthogonally polarized beams, thereby further increasing the brightness of the combined beam producible by available laser diodes.

The invention also relates to apparatus, such as a laser plotter or a direct-write film device for the production of printed circuit boards or for graphic art applications, constructed in accordance with the above-described method.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
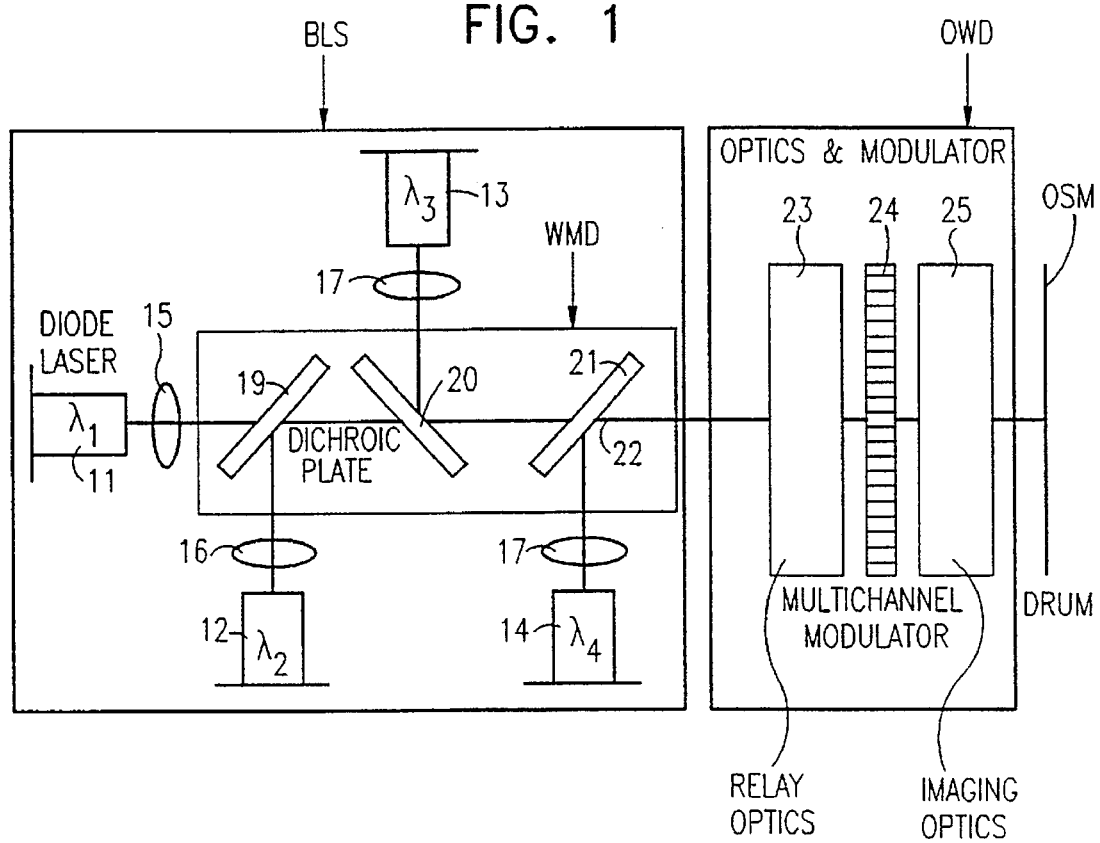
FIG. 1 is a schematic illustration of a diode laser optical head which is based on combining numerous diode lasers using dichroic plates.

FIG. 1 illustrates one preferred embodiment of the present invention wherein a laser plotter head comprises a bright light source, generally designed BLS, which combines a plurality of diode lasers emitting at different wavelengths; a wavelength multiplexing device, generally designated WMD, for combining the lasers' beams to a single beam, and an optical writing device, generally designated OWD for writing with said single beam on an optically-sensitive medium OSM.

in order to estimate the desired optical power, P, that is required for a practical exposure of a DWF, the equation for the energy density sensitivity, E, of the DWF, as a function of the recording rate, F (number of pixels/sec), and the pixel size (resolution), S, is given as $$E=P/(F*S^2), \qquad \text{Eq. 1}$$

Substituting practical values such as E=100 mj/cm2, F=100*$10^6$ pixels/sec, S=0.25 mil yields a desired optical power, P (on the film) of about 4 watts. The total optical efficiency of the specific optical system must be considered in order to evaluate the required laser power source, $P_1$.

In accordance with the typical calculation above, a practical optical head requires optical power of several watts depending on the optical efficiency. At present, it is possible to use a single mode diode laser with optical power of less than 1 watt CW (Spectra Diode Labs; SDL-5760 series, single mode MOPA diode laser), or high-brightness broad area lateral index guided stucture diode laser with optical power of less than 4 watt CW (Spectra Diode Labs; SDL-2300 series).

In the embodiment illustrated by FIG. 1, a diode laser optical head for the DWF plotter comprises, for instance, four high brightness lateral broad area (multiple mode) diode lasers 11, 12, 13, 14 with the wavelengths $\lambda_1$, $\lambda_2$, $\lambda_3$, $\lambda_4$. The SDL-2300 series of laser diodes (products of Spectra Diode Labs of the USA) may be used. The SDL-2300 series lasers are partially coherent broad area emitters with relatively uniform emission over the emitting aperture. The far field in the plane parallel to the junction exhibits the complex pattern typical of broad area emitters and is nearly gaussian in the plane perpendicular to the junction. It is possible to combine three or four diode lasers from SDL-2370 series, whereas the output power for each is approximately 2 watts and each of which emits light at a different wavelength between 790 nm and 835 nm.

One of the main features of our invention is the provision of the wavelength multiplexing device WMD, which, in preferred embodiments, consists either of dichroic beam combiners (FIGS. 1–2), or a holographic optical element (FIG. 4), such, for example, as described in W. J. Tomlinson, "Wavelength Multiplexing in Multimode Optical Fibers", Appl. Opt. 16, 2180, 1977; or B. Moslehi, P. Harvey, Joel Ng, and T. Jannson "Fiber-Optic Wavelength-Division Multiplexing and Demultiplexing Using Volume Holographic Grating", Opt. Lett. 14, 1088, 1989.

Dichroic beam combiners (beam splitters) are more readily available than holographic optical elements (HOE). The dichroic beam combiner is used to selectively reflect and transmit light according to its wavelength. The dichroic plates exhibit high transmission for a wavelength or band of wavelengths, and high reflectivity for a different wavelength or band. Long wave pass (LWP) means longer wavelengths are transmitted through the mirror, short wave pass (SWP) means shorter wavelengths are transmitted. Dichroic plates are used in many applications where separation or combination of two wavelengths or wavelength bands is required. The dichroic plates are produced using specially designed multilayer dielectrics that maximize the transmission and reflectance at specififed wavelengths and give a sharp edge between the two.

Figure 1A:
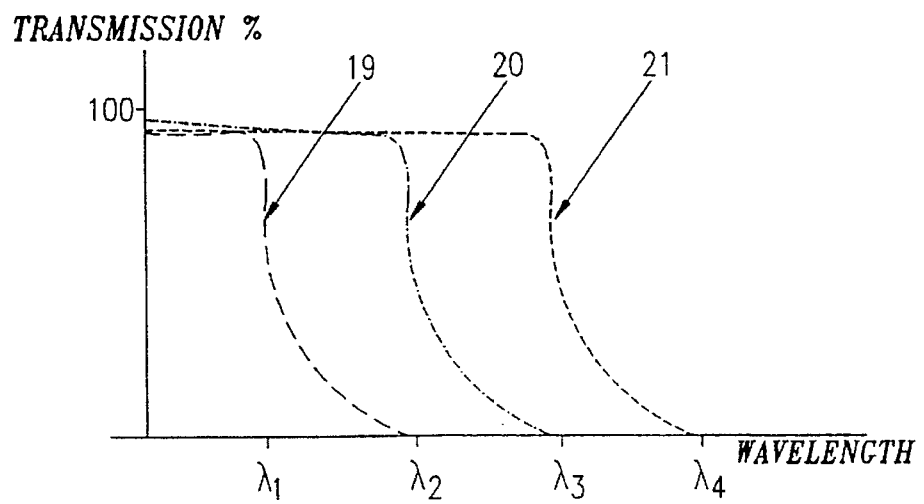
FIG. 1a illustrates transmission curves for the dichroic plates of FIG. 1.

In the preferred embodiment illustrated by FIG. 1, the beams emitted by the diode lasers, 11, 12, 13 and 14, and passed through the collimating lenses 15, 16, 17 and 18 of the lasers, are combined by dichroic plates 19, 20, 21. The emission wavelengths of these lasers preferably satisfy $\lambda_1 < \lambda_2 < \lambda_3 < \lambda_4$. In our preferred embodiment the dichroic wavelength plate 19 transmits light of wavelength $\lambda_1$ and reflects light of wavelength $\lambda_2$; the dichroic plate 20 transmits light of $\lambda_1$ and $\lambda_2$ and reflects light of wavelength $\lambda_3$; and the dichroic plate 21 transmits light of wavelength $\lambda_1$, $\lambda_2$, $\lambda_3$ and reflects light of wavelength $\lambda_4$. The transmission curves for such dichroic plates (SWP) are schematically illustrated by FIG. 1a.

The combination efficiency of each dichroic plate depends on the difference in the wavelengths of the transmitted and reflected beams and on the angle of incidence of the reflected beam, which would preferably be as small as possible. The combined beam from plates 19, 20 and 21 travels along optical axis 22 to the optical writing device OWD. This device consists of relay optics 23, a multichannel modulator 24, and imaging optics 25. The relay optics, which is a beam expander, should fit to the modulator 24 to illuminate it with a single light beam of narrow line-like cross section.

The multichannel modulator 24 may be, for example, a multichannel magneto-optics modulator, or a multichannel acoustic transducer electrode structure for bulk wave acousto-optic device, such as described in U.S. Pat. No. 4,516,838. The multichannel modulator is chosen to correspond to the characteristics of the laser (junction area and angle of divergence), to the working wavelength range of the multiplexing device and to the required size of the writing spot. For our preferred embodiment, we used an acousto-optic multichannel modulator 24 with 32 independently modulated channels.

Multichannel modulator 24 is illuminated by the single line beam creating multiple spots, which are modulated by the modulator (U.S. Pat. No. 4,506,275). The multispot array is imaged onto an external rotating drum, containing the optically-sensitive film OSF. The DWF which is exposed to the modulated spots is attached tightly to the drum. It is possible to exploit this invention for internal drum or for flat bed plotters too. The modulated pixels formed by the modulator are imaged (in reduction) by telecentric demagnifying telescope 25 on the recorded film.

Figure 2:
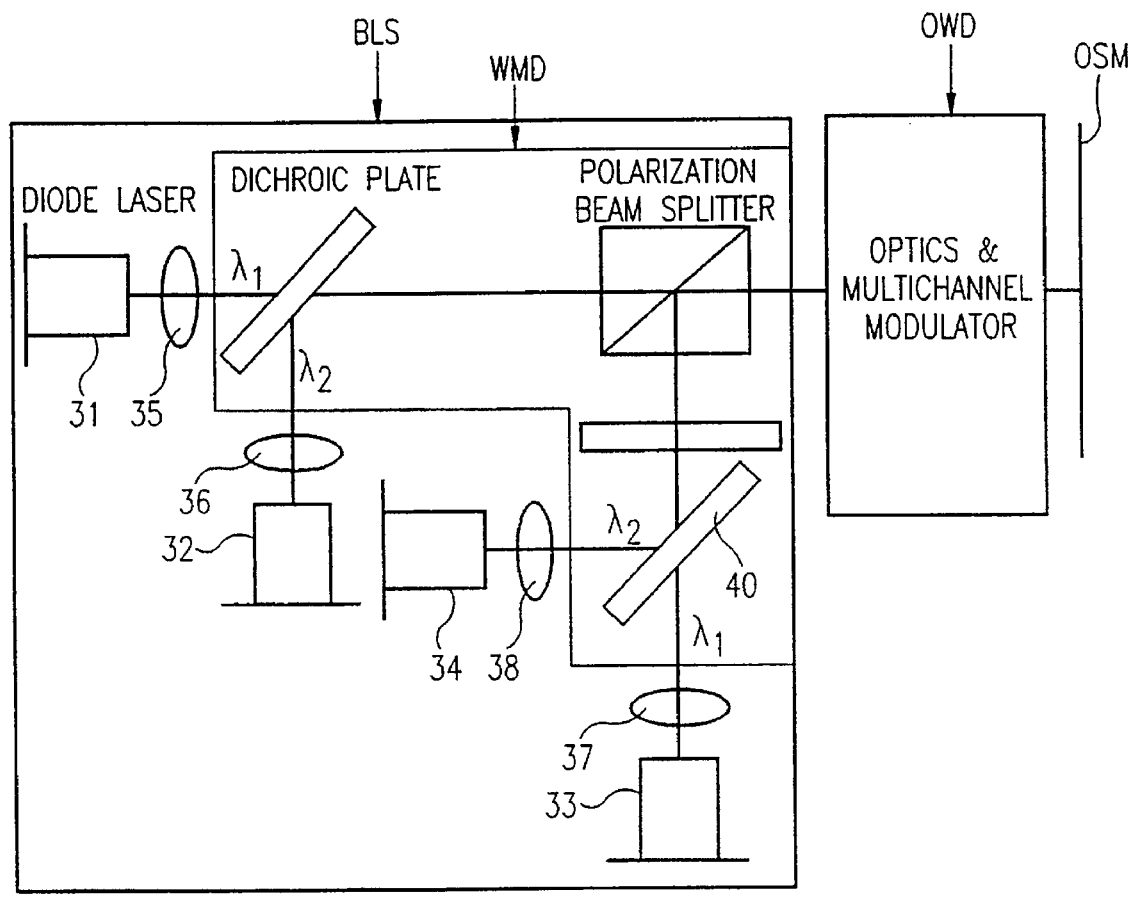
FIG. 2 illustrates an optical head which is based on wavelength and polarization multiplexing.

FIG. 2 is a schematic diagram of a second preferred embodiment of the present invention, and shows the possibility to exploit both the polarization beams combiner and the wavelength multiplexing for combining a greater number of lasers than is possible with the first embodiment. In FIG. 2 the output beams of a plurality of diode lasers in the bright light source BLS are combined in the wavelength multiplexing device WMD by using both wavelength and polarization multiplexing. The sources comprise for instance four diode lasers 31, 32, 33, 34 and their collimating lenses 35, 36, 37, 38. The diode lasers 31, 32 which emit light beams at different wavelengths $\lambda_1$ and $\lambda_2$ respectively, are combined by using dichroic plate 39. The same procedure is done for diode lasers 33 and 34, where the dichroic plate is designated 40. The polarization of the combined beam 43 is rotated 90° by passing through a broad band half-wave plate 41 (for example, Achromatic Retarders; birefringent polymer, a product of Meadowlark Optics), but the profile of the combined beam 43 is not altered by the half-wave plate. The result is two pairs of combined beams 42 and 43 with orthogonal polarizations. The polarization beam splitter 44 transmits the combined beam 42 and reflects the combined beam 43.

Note that it is possible to reverse the above described sequence, that is to first combine diode lasers 31, 32 and 33, 34 by polarization combiners, and then to combine the two combined beams by WMD combiners. The high power combined beam is passed through the optics and the multichannel modulator assembly 3 as was illustrated in FIG. 1.

Figure 3:
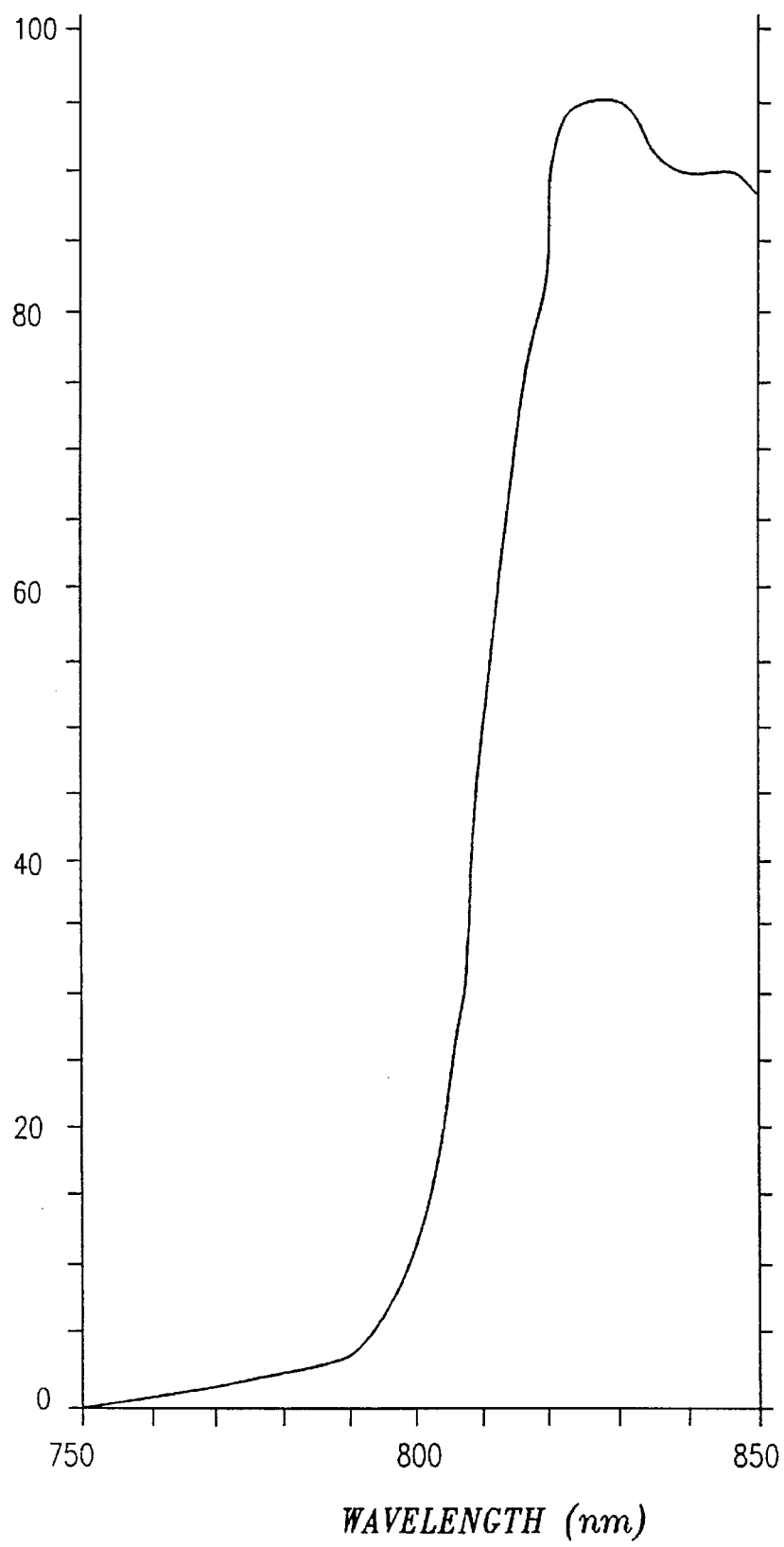
FIG. 3 is a transmisson curve of a typical dichroic plate.

To demonstrate the wavelength multiplexing method, we combined four diode lasers by using the configuration shown in FIG. 2. We used four diode lasers (SDL-2370, 2 watt), where the wavelength $\lambda_1$ and $\lambda_2$ were 830 nm and 795 nm respectively. The transmission curve for our specific dichroic plates is shown in FIG. 3 for s polarization's, where we used polygonal beam combiner, P.N.740120-E120-34755 made by Elop Electronics Industries Ltd. of Israel. The measured combined power efficiency of a single wavelength multiplexing device WMD (combining two diode lasers) was about 94 percent.

Figure 4:
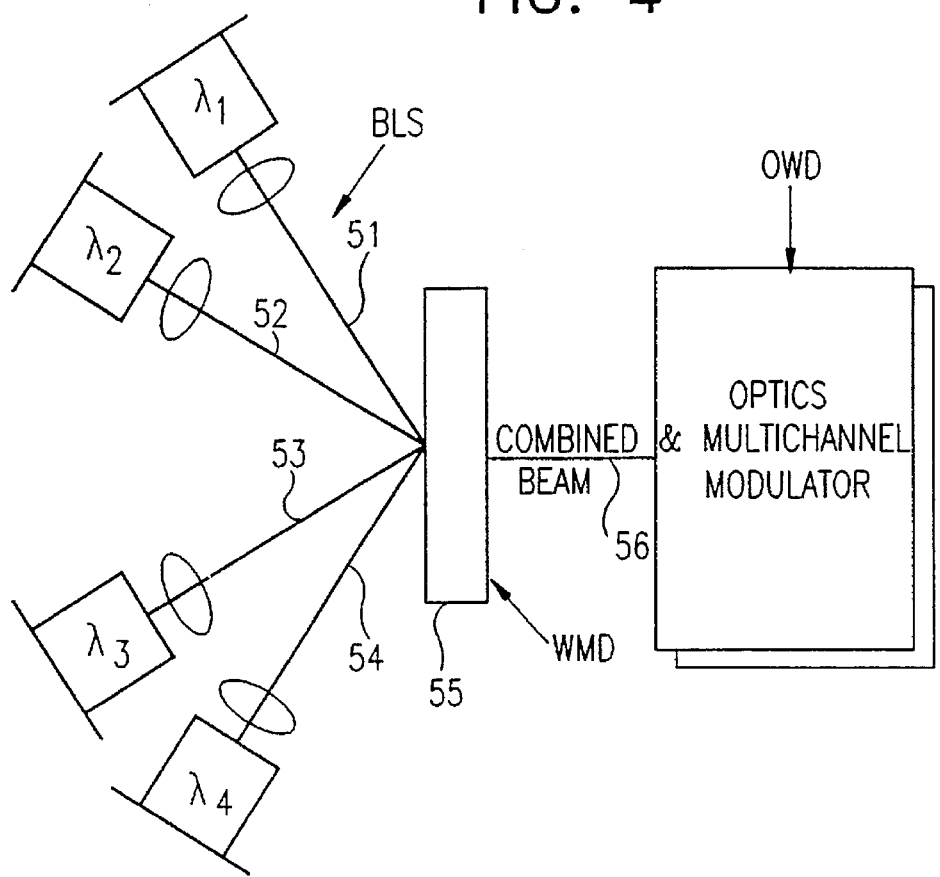
FIG. 4 illustrates a wavelength multiplexing optical head which is based on a holographic optical element.

FIG. 4 illustrates a wavelength multiplexing device WMD which is based on a holographic optical element (HOE). Holographic optical elements are ideal for wavelength multiplexing for a number of reasons; the most important is the possibility of combining a plurality of diode lasers using a single HOE. Furthermore, thick holograms can be made with diffraction efficiencies approaching 100%, with 70–95% being routinely achieved. Such holograms intrinsically have a high dispersion and, depending on the material and fabrication conditions, can be made to consist of a narrow bandpass (filter) or a broad bandpass (multiplexer). In addition, the holographic multiplexers can be made to operate with parallel light, requiring the use of external lenses, or can be made to operate directly with the diverging output of the diode lasers, performing the functions of collimation, wavelength combination and reshaping the output wave front with a single element. The advantage of such a multifunctional HOE is the elimination of all other optical elements and the improvement of alignment and stability. The performance of the HOE is ideal (without aberrations) when the readout geometry and wavelength are identical to the recording geometry and wavelength.

The problem with such a multifunctional HOE is that most holographic materials require visible light for fabrication and the wavelength regions of interest for DWF are, in general, near IR radiation. One can easily fabricate parallel light holograms for operation in these regions, but holograms with optical power are more difficult since the readout wavelengths differ from the recording wavelengths bringing out severe aberrations. In order to minimize the aberrations, it is necessary to resort to computer originated holograms based on computer generated holograms (R. C. Fairchild and J. R. Fienup, "Computer Originated Aspheric Holographic Optical Elements", Opt. Eng. 21, 133 1982), or to the recursive technique, where the desired HOE is recorded with non-spherical waves, derived from interim holograms (Y. Amitai and A. A. Friesem, "Recursive Design Techniques for Fourier Transform Holographic Lenses", Opt. Eng. 26, 1133, 1987)

Several procedures have been proposed for designing and recording the HOE having a complicated grating function. These are based on numerical iterative ray tracing techniques, or on an analytic ray tracing procedure involving minimizing the mean-squared difference of the propagation vector components between the actual output wave fronts and the desired output wave fronts, (E. Hasman and A. A. Friesem, "Analytic Optimization for Holographic Optical Elements", J. Opt. Soc. Am A 6, 62 1989) Such an HOE is very useful for fiber optical communication as well as data links (M. Lida, H. Asakura, K. Eda and K. Hagiwara, "Narrow-Band Ten-Channel Optical Multiplexer and Demultiplexer using a fourier Diffraction Grating", App. Opt. 31, 4051, 1992). Several companies produce holographic elements; among them are Kaiser Optical Systems, Inc., and POC Physical Optics Corporation of the USA.

In the preferred embodiment illustrated by FIG. 4, the wavelength multiplexing device WMD is in the form of the HOE 55 and combines the laser beams denoted by 51, 52, 53, 54 having wavelengths $\lambda_1, \lambda_2, \lambda_3, \lambda_4$, respectively, of the bright light source BLS. It is possible to use phase holographic film such as bleached silver (AgHal) emulsions, Dichromated Gelatin emulsions or polymeric films (products of Eastman Kodak, Agfa, Dupont) for achieving high diffraction efficiency. The combined beam 56 is passed through the optical writing device OWD consisting of optics and a multichannel modulator.

Figure 5:
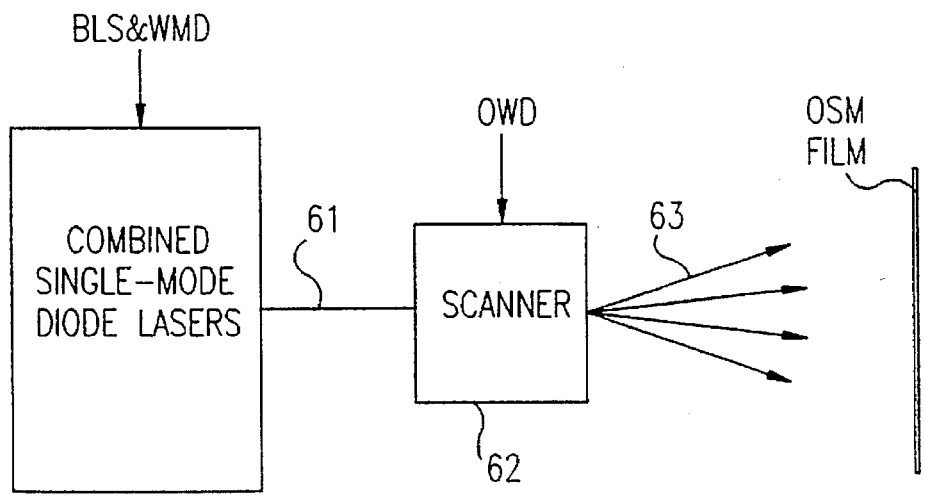
FIG. 5 is a block diagram of a diode laser optical head which is based on combining numerous single mode diode lasers directed by a scanner.

FIG. 5 illustrates another embodiment of the invention in the form of a laser plotter head comprising a plurality of single mode diode lasers in the bright light source BLS, combined by using a wavelength multiplexer device WMD as described above. The high power diffracted limited diode laser is produced by Spectra Diode Labs; 1 watt CW single mode MOPA diode laser, SDL-5760 series.

In FIG. 5 wavelength multiplexing device WMD is directed to a conventional scanner 62 such as a rotating polygon reflector. A high power optical head as such can be used for any plotter concept. The scanner directs the beam 63 onto a recording medium OSM, which may be on an internal drum, external drum, or flat bed.

While the invention has been described with respect to several preferred embodiments, it will be appreciated that these are set forth merely for purposes of example, and that many other variations, modifications and applications of the invention may be made.

I claim:

1. A method of recording on an optically-sensitive medium optically-sensitive to light of a wavelength within a predetermined sensitivity range, comprising the steps of: providing a plurality of at least two light sources each emitting a source beam of light of a different wavelength falling within the sensitivity range of said optically-sensitive medium; combining, by wavelength multiplexing, said plurality of source beams into a combined beam of at least on watt of power; and directing said combined beam onto said optically-sensitive medium.

2. The method according to claim 1, wherein said a least two light sources are diode lasers of different wavelengths.

3. The method according to claim 1, wherein the beams of at least two of said light sources are combined by a dichroic combiner.

4. The method according to claim 1 wherein the beams of at least two of said light sources are combined by a holographic element combiner.

5. The method according to claim 1, wherein said plurality of light sources include at least two additional light sources producing two orthogonally-polarized beams, and wherein said combined beam is produced by also combining said two orthogonally-polarized beams.

6. The method according to claim 1, wherein said combined beam is directed onto the optically-sensitive medium via a relay optical device, a multi-channel modulator, and an imaging optical device.

7. The method according to claim 1, wherein said optically-sensitive medium is a direct write medium used for producing printed circuit boards.

8. The method according to claim 1, wherein the recording is made by means of an optical plotter recording on a recording medium, wherein said optically-sensitive medium is the recording medium of the optical plotter, and receives said combined beam by way of a scanner.

9. Apparatus for recording on an optically-sensitive medium optically-sensitive to light of a wavelength within predetermined sensitivity range, comprising: a plurality of at least two light sources each emitting a source beam of light of a wavelength falling within the sensitivity range of said optically-sensitive medium; an optical combining system including a wavelength multiplexer for combining said plurality of source beams into a combined beam of at least one watt of power; and an optical system for directing said combined beam onto said optically-sensitive medium.

10. The apparatus according to claim 9, wherein said at least two light sources are diode lasers of different wavelengths.

11. The apparatus according to claim 9, wherein said combining system includes a dichroic combiner for combining the beams of said at least two light sources.

12. The apparatus according to claim 9, wherein said combining system includes a holographic element combiner for combining the beams of at least two of said light sources.

13. The apparatus according to claim 9, wherein said optical combining system further includes an optical polarizer system for orthogonally polarizing two beams from said plurality of light sources, and a beam splitter for combining said orthogonally-polarized beams.

14. The apparatus according to claim 9, wherein said optical system includes a relay optical device, a multi-channel modulator, and an imaging optical device for directing said combined beam onto said optically-sensitive medium.

15. The apparatus according to claim 9, wherein said optical system includes an optical scanner for optically scanning said combined beam on said optically-sensitive medium.

16. Apparatus for recording on an optically-sensitive medium optically-sensitive to light of a wavelength within a predetermined sensitivity range, comprising: a plurality of diode lasers each emitting a source beam of light of a different wavelength falling within the sensitivity range of said optically-sensitive medium; an optical combining system including a wavelength multiplexer for combining at least two of said plurality of source beams into a combined beam of at least one watt of power; and an optical system for directing said combined beam onto said optically-sensitive medium.

17. The apparatus according to claim 16, wherein said optical combining system includes a dichroic combiner for combining said at least two source beams.

18. The apparatus according to claim 16, wherein said optical combining system further includes an optical polarizer system for orthogonally polarizing two further source beams, and a beam splitter for combining said orthogonally-polarized beams.

* * * * *

UNITED STATES PATENT AND TRADEMARK OFFICE
CERTIFICATE OF CORRECTION

PATENT NO. : 5,625,403
DATED : April 29, 1997
INVENTOR(S) : Erez HASMAN

It is certified that error appears in the above-indentified patent and that said Letters Patent is hereby corrected as shown below:

Title page, item

"[75] Inventor: Erez HAZMAN" change to --[75] Inventor: Erez HASMAN--

Signed and Sealed this

Thirtieth Day of June, 1998

Attest:

Attesting Officer

BRUCE LEHMAN
Commissioner of Patents and Trademarks